US006638895B1

(12) United States Patent
Karapetrov et al.

(10) Patent No.: US 6,638,895 B1
(45) Date of Patent: Oct. 28, 2003

(54) METHOD FOR FABRICATING HIGH ASPECT RATIO STRUCTURES IN PEROVSKITE MATERIAL

(75) Inventors: Goran T. Karapetrov, Naperville, IL (US); Wai-Kwong Kwok, Downers Grove, IL (US); George W. Crabtree, Chicago, IL (US); Maria Iavarone, Casoria (IT)

(73) Assignee: The University of Chicago, Chicago, IL (US)

( * ) Notice: Subject to any disclaimer, the term of this patent is extended or adjusted under 35 U.S.C. 154(b) by 215 days.

(21) Appl. No.: 09/696,050

(22) Filed: Oct. 25, 2000

Related U.S. Application Data

(60) Provisional application No. 60/161,881, filed on Oct. 27, 1999.

(51) Int. Cl.$^7$ .................... H01L 39/24; H01L 21/304; C23F 1/00
(52) U.S. Cl. .................... 505/320; 505/325; 505/410; 505/413; 438/705; 204/157.44; 216/87; 216/96
(58) Field of Search ................ 505/320, 325, 505/410, 413, 820; 438/705; 204/157.44; 216/49, 51, 87, 96

(56) References Cited

U.S. PATENT DOCUMENTS 5,096,882 A * 3/1992 Kato et al. .................... 505/1
5,912,210 A * 6/1999 Krusin-Elbaum et al. ... 505/121

OTHER PUBLICATIONS

Dai et al "Simultaneous Observation of Columnar Defects and Magnetic Flux Lines in High–Temperature Bi2Sr2CaCu2O8 Superconductors", Science, vol 265, Sep. 1994, 1552–1555.*

Little–Parks Oscillations of $T_c$ in Patterned Microstructures of the Oxide Su–Superconductor $YBa_2Cu_3O_7$: Experimental Limits on Fractional–statistics–Particle Theories, P.L. Gammel et al., Physical Review B, vol. 41, No. 4, Feb., 1, 1990 (Abstract Only).

A Novel Multilayer Circuit Process Using YBa2Cu3Ox/srTiO3 Thin Films Patterned by Wet Etching and Ion Milling, Appl. Phys. Lett 69 (18), Oct. 28, 1996; Amer. Inst. of Physics (Abstract Only).

Improved Aqueous Etchant for High Tc Superconductor Materials, Appl. Phys. Lett. 60 (17), Apr. 27, 1992, Amer. Inst. of Physics (Abstract Only).

Microlithography of High–Temperature Superconducting Films Laser Ablation vs. Wet Etching, IEEE Transactions of Magnetics, vol. 25 N. 2 Mar. 2, 1989 (Abstract Only).

* cited by examiner

Primary Examiner—Mark Kopec
(74) Attorney, Agent, or Firm—Emrich and Dithmar

(57) ABSTRACT

A method of fabricating high aspect ratio ceramic structures in which a selected portion of perovskite or perovskite-like crystalline material is exposed to a high energy ion beam for a time sufficient to cause the crystalline material contacted by the ion beam to have substantially parallel columnar defects. Then selected portions of the material having substantially parallel columnar defects are etched leaving material with and without substantially parallel columnar defects in a predetermined shape having high aspect ratios of not less than 2 to 1. Etching is accomplished by optical or PMMA lithography. There is also disclosed a structure of a ceramic which is superconducting at a temperature in the range of from about 10° K. to about 90° K. with substantially parallel columnar defects in which the smallest lateral dimension of the structure is less than about 5 microns, and the thickness of the structure is greater than 2 times the smallest lateral dimension of the structure.

18 Claims, 7 Drawing Sheets

Superconducting Material Modification

- Heavy ion irradiation creates amorphous tracks
- Preferential chemical etching along the irradiated channels 20μm wide trenches (dark) etched into YBCO single crystal High Aspect Ratio Microactuators    MicroRotors Microturbine

METHOD FOR FABRICATING HIGH ASPECT RATIO STRUCTURES IN PEROVSKITE MATERIAL

RELATED APPLICATIONS

This application, pursuant to 37 C.F.R. §1.78(c), claims priority based on provisional application Ser. No. 60/161,881 filed Oct. 27, 1999.

CONTRACTUAL ORIGIN OF THE INVENTION

The United States Government has rights in this invention pursuant to Contract No. W-31-109-ENG-38 between the U.S. Department of Energy and The University of Chicago representing Argonne National Laboratory.

TECHNICAL FIELD

This invention relates to a method for creating high aspect ratio structures in perovskite materials, including high-temperature superconductors using ion irradiation to modify bulk superconducting material.

BACKGROUND OF THE INVENTION

There has been a rapid growth in the number of applications based on Micro-electromechanical Systems (MEMS). In 1997, the MEMS market exceeded U.S. $2 B, and the growth curve is exponential resembling that of the semiconductor industry. The most common applications include pressure and inertial sensing (automotive air bags, gyroscopes) while immediate growth potential is in "light handling" applications (fiber-optic interconnects and switches). This relatively fast transition from R&D to commercial applications is due to the fact that the current MEMS technology is based on Si and is therefore 100% compatible with the semiconductor manufacturing process. Although providing a short-term advantage in the commercial acceptance of MEMS technology, the limitation of the Si materials significantly restricts the diversity of MEMS applications.

The most serious materials limitation in MEMS technology is in producing and controlling motion. The choice of Si and GaAs confines the available actuation mechanisms to electrostatic and thermal. These microactuation methods are either weak (electrostatic) or highly dissipative and slow (thermal). Magnetic actuation using superconductors is expected to provide a significant increase in energy density, a faster response time, and very low dissipation.

Irradiation with ions is a well-known technique that has been extensively used in nuclear physics and materials science. In material science the effect of exposure to ion irradiation has mostly been used to study the target material properties. Any applications of ion irradiation are mainly derived from damages and/or modification inflicted on materials by the impinging ions.

When energetic ions hit the target material they create tracks (defects) inside the target. The microscopic modification of the material is concentrated along the paths traversed by the impinging ions through the material. While passing through the target material the ions lose kinetic energy due to electronic and nuclear scattering with the target molecules. Depending on the combination of target material, the ion beam type, and the kinetic energy of the projectile ions different types of defects can be produced in the target material. The radiation effectively modifies the target material structure and with it the local chemical and physical properties of the irradiated material, that is the tracks or defects. For example, it is well known that ion irradiation in high temperature superconductors increases the critical current.

SUMMARY OF THE INVENTION

We have discovered a novel method to modify and process high temperature superconductors (HTSC) on a microscopic level that allows effective integration of superconducting materials into a variety of structures such as MEMS and the invention also includes the structures themselves. This discovery creates an opportunity to exploit the unique properties of superconductors and to design a qualitatively new class of superconducting smart microstructures that can exert extremely high magnetic actuation force densities with virtually no dissipation. These high actuation force densities provide the long-needed mechanism for transmitting mechanical power from the microscopic world of MEMS to the macroscopic world of traditional technology. This invention integrates basic materials science, creative materials modification, and novel device fabrication to dramatically expand the horizon for MEMS technology, with respect to high temperature superconductors, such as yttrium-based systems, bismuth based systems and thallium based systems.

This invention relates to a method for fabricating high aspect ratio structures, as well as the structures themselves, in perovskite and other materials having important properties useful in superconducting, optical, electronic, electrochemical, and other systems. Thicker structures in these systems allows the use of larger forces and/or power levels in devices such as optical switches, miniature pumps, RF and microwave receivers and transmitters, and other products. Fabrication techniques for thinner structures, such as structures having thicknesses in the range of from about $0.1-5$ $\mu$m, $0.1$ $\mu$m to about 5 $\mu$m have been difficult to apply in the fabrication of thicker structures, such as those having thicknesses greater than about 10 $\mu$m, and the problems have led to the development of this invention. It is understood that the invention may be the first of a more promising method to produce thicker structures with the required precision and certain other characteristics.

More particularly, the invention relates to new structures and a method for fabricating new structures having a thickness in the order of 10–20 microns and above from a variety of superconducting materials through a multiple step operation. With a perovskite material useful as a high temperature superconductor as an example, the invention involves the steps of applying controlled spatial ion irradiation in a predetermined pattern to form an etchable surface and underlying material and a non-etchable surface and underlying material. Subsequently, a chemical or other etchant, such as EDTA (ethylene diamine tetracetic acid) or KOH or NaOH or Br in methanol ethanol is used to remove the irradiated material to leave the desired structure. The shape of the structure is achieved with a high precision on the order of 0.1 $\mu$m.

The ion irradiation is effective at to depths of at least 10 microns and up to about 100 microns, depending on the energy of the ion beam and the particular ions used. Heavy ions, such as Pb, Au and U are preferred. Chemical etchants include KOH, NaOH and EDTA as well as mineral acids, such as Br in alcohol. As described briefly above, the thicker structures provided by this invention will allow the application or generation of larger forces and/or power levels to a variety of structures or devices such as optical switches, pumps, RF transmitters, and the like, in optical, micromechanical, and other systems.

Our newly discovered process of controlled nano-size structural and chemical bulk modification of HTSC (YBCO is used by way of example only) provides a lithographic process for forming very high tolerance high aspect ratio superconducting microstructures. By high aspect ratio, we mean a structure having a generally flat surface, a ratio of the thickness of the depth or thickness of the structure to the smaller lateral dimension of the structure of not less than 2:1 and preferably greater than 3:1. A side wall substantially perpendicular to the flat surface is needed. In addition, the invention produces precisely controlled introduction of strong pinning centers inside the HTSC material. As a result, smart superconducting microstructures can be produced with very well defined spatial and electromagnetic characteristics. Their use in MEMS as well as in other areas opens a new class of actuation devices that feature very high actuation forces with very small losses.

Commercial applications are in three basic areas: actuation, sensing and superconducting passive electronic components. Actuation devices include superconducting micromachines such as micromotors, micropumps, and drives that exploit the high energy density offered by HTSC materials. Sensing applications include airborne telemetry and tunable IR devices based on HTSC bolometers and SQUIDS. Passive electronics components for wireless communication such as tunable high power RF and microwave filters/resonators will have significantly higher power handling capability due to the 3D bulk character and high aspect ratio of the devices produced by our method. The technology also applies to flight and space applications of microactuators due to the large ratio of useful work to device weight.

Accordingly, it is an object of the present invention to provide a method of fabricating high aspect ratio ceramic structures, comprising providing a perovskite or perovskite-like crystalline material; exposing a selected portion of the crystalline material to a high energy ion beam for a time sufficient to cause the crystalline material contacted by the ion beam to have substantially parallel columnar defects, and thereafter etching selected portions of the material having substantially parallel columnar defects leaving material with and without substantially parallel columnar defectors in a predetermined shape having high aspect ratios of not less than 2 to 1.

Yet another object of the invention is to provide a structure a structure of a ceramic which is superconducting at a temperature in the range of from about 10° K. to about 90° K. having substantially parallel columnar defects in which the smallest lateral dimension of the structure is less than about 5 microns, and the thickness of the structure is greater than 2 times the smallest lateral dimension of the structure.

Still another object of the present invention is to provide A structure made by the method of fabricating high aspect ratio ceramic structures, comprising providing a perovskite or perovskite-like crystalline material; exposing a selected portion of the crystalline material to a high energy ion beam for a time sufficient to cause the crystalline material contacted by the ion beam to have substantially parallel columnar defects, and thereafter removing selected portions of the material having substantially parallel columnar defect areas leaving material with substantially parallel columnar defects in a predetermined shape having high aspect ratios of not less than 2 to 1.

A final object of the present invention is to provide a method of fabricating high aspect ratio ceramic structures, comprising providing a high temperature superconducting perovskite or perovskite-like crystalline material; masking some of the material with a substance capable of shielding the material from a high energy ion beam, exposing the unshielded portion of the crystalline material to a high energy ion beam for a time sufficient to cause the crystalline material contacted by the ion beam to have substantially parallel columnar defects to form a first geometrical shape of the high temperature superconducting material with improved pinning characteristics, thereafter etching selected portions of the material having substantially parallel columnar defects by e-beam or optical lithography leaving material with and without substantially parallel columnar defectors in a second predetermined shape having high aspect ratios of not less than 2 to 1.

BRIEF DESCRIPTION OF THE DRAWINGS

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

DETAILED DESCRIPTION OF THE INVENTION

Figure 1:
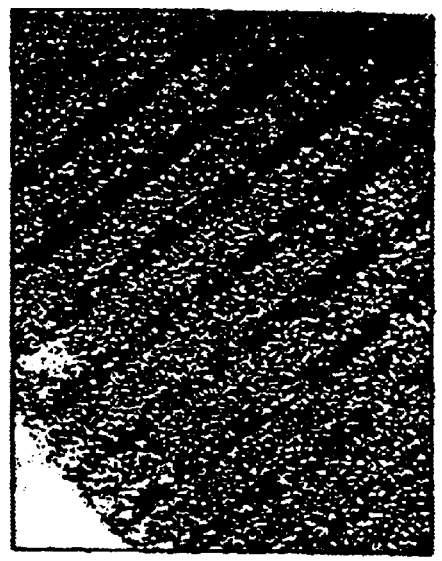
FIG. 1 is a micrograph of 20 $\mu$m wide trenches (dark) etched into single crystal YBCO.
Figure 4:
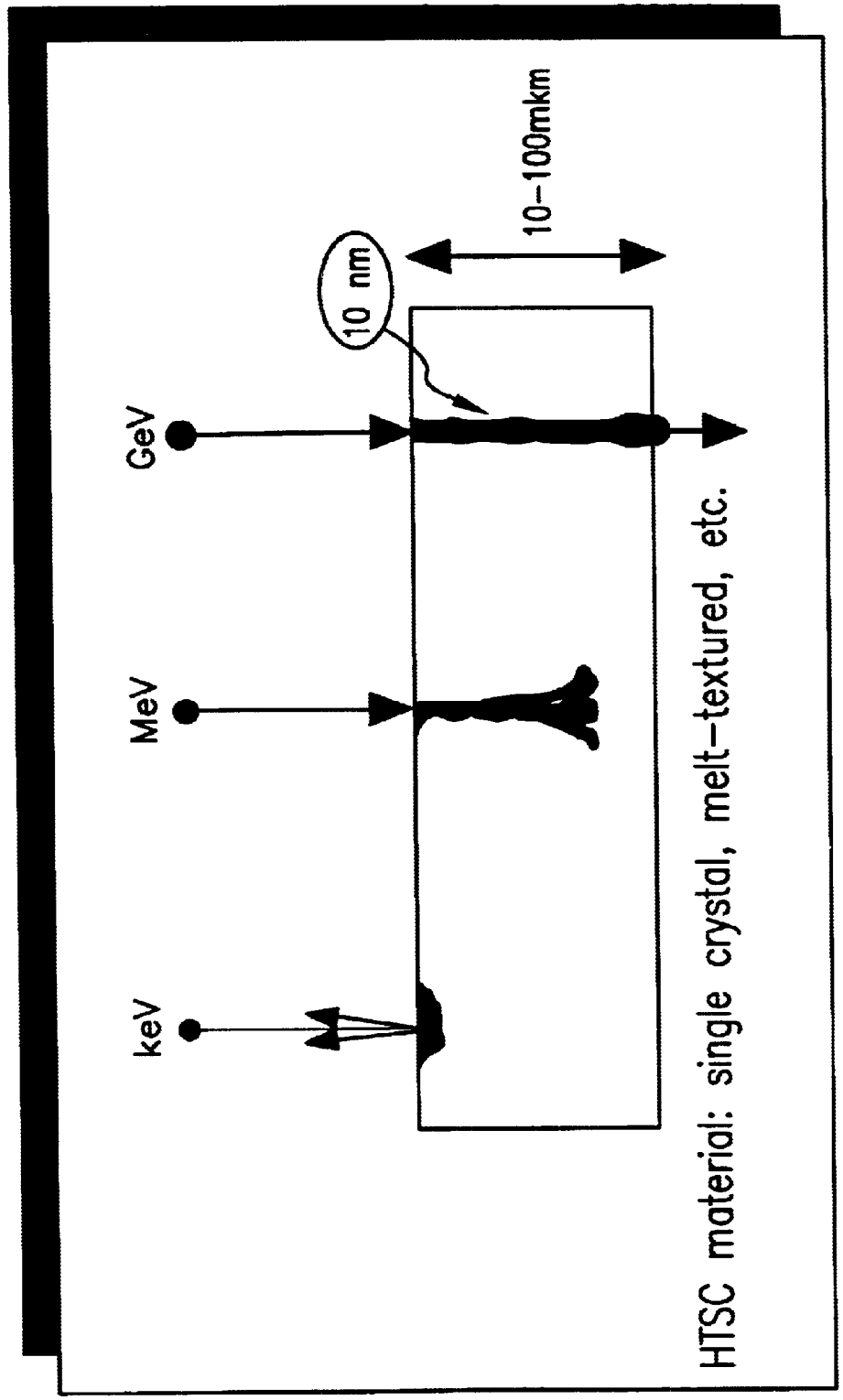
FIG. 4 is a schematic showing results of heavy ion irradiation of bulk superconductors.

This invention exploits the fact that by controlled spatial ion irradiation, a well-defined bulk chemical and physical modification of the target material can be achieved as seen in the parallel tracks or trenches of amorphous material in FIG. 1. This is due to the substantially parallel columnar defects produced in high temperature superconductor material by irradiation with heavy-ions. The changes in the chemical and physical properties of the material can be further exploited both directly and/or by using appropriate post processing methods. For instance, we can use irradiated areas as magnet poles since they have enhanced superconducting properties or create geometrical shapes out of superconductors. In this particular example, wet chemical etching is used to selectively remove the irradiated material from the superconductor as illustrated in FIG. 1, which shows parallel tracks of irradiated superconductor material. In general, high energy, at least 100 meV and preferably greater than about 1 GeV heavy ion beams (see FIG. 4) which are focused, parallel and perpendicular to the flat surface of the target are used, as disclosed a paper published Jan. 1, 1993 in Volume 47, number 1 of Physical Review by The Schuster et al., entitled "Enhancement of Critical Current Densities by Heavy-Ion Irradiation in $YBa_2Cu_3O_{7-\delta}$, the disclosure of which is incorporated by reference. Observed Using The High-Resolution Farady Effect", Other chemical methods such as wet etching, dry etching, Reactive Ion Etching (RIE), can be used to promote selective etching of the irradiated superconductor material.

Figure 2:
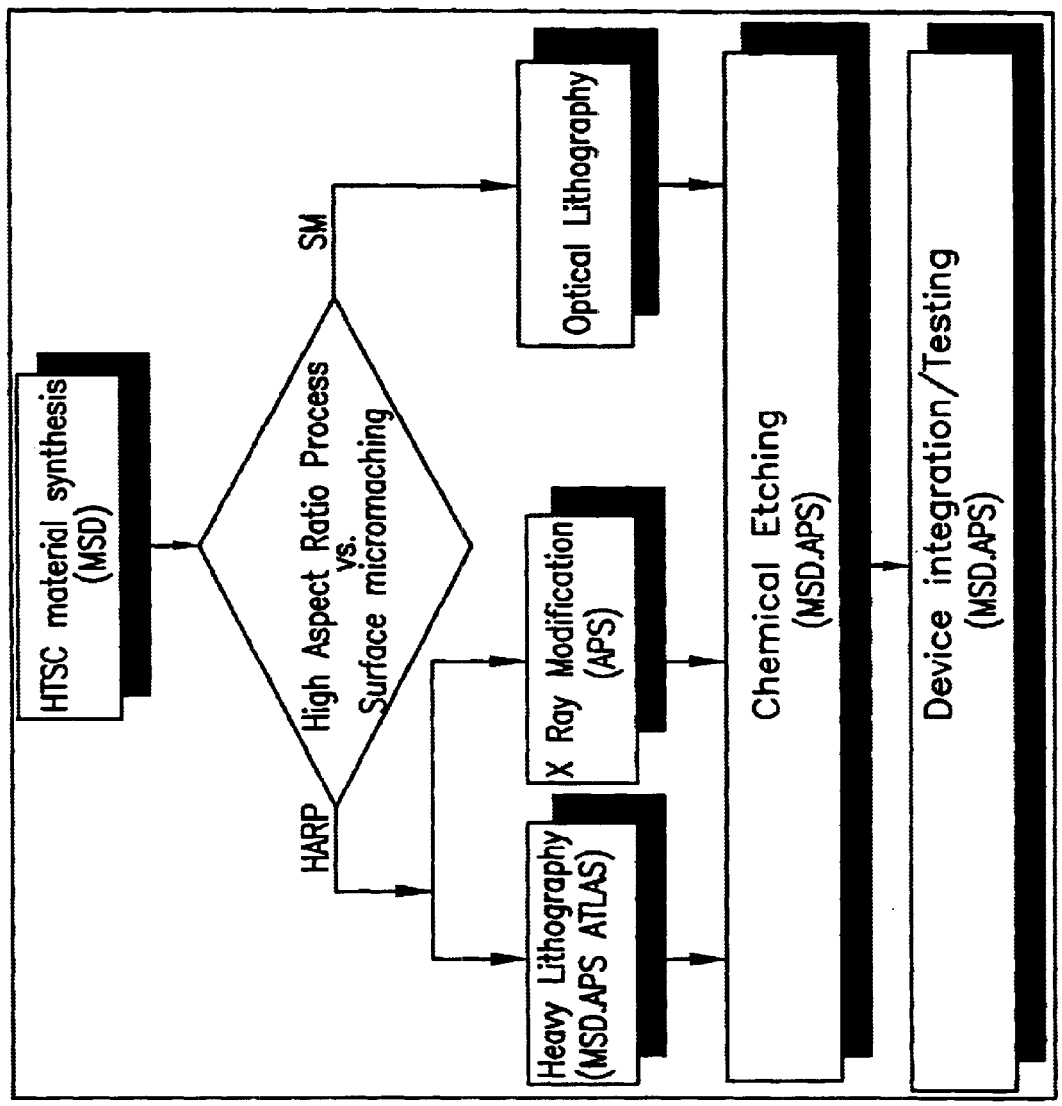
FIG. 2 is a flow sheet for two methods of surface and bulk micromachining.

Referring to FIG. 2 of the drawings, the method comprises the following three steps:

Preparation of the pure perovskite or superconducting material by a variety of well known methods. The exact method of preparation of the bulk superconducting material does not affect the invention.

Initial superconducting material may be, for example, single crystal, polycrystalline (melt-textured, films), or ceramics; however, other forms of superconducting material may be used and are applicable to the present invention. Materials suitable for the present invention include such families like REBaCuO (RE=Y,Nd,Gd, Eu (in chemical terms—the group of lanthanoids) BiSrCaCuO, and other superconducting materials such as Tl based systems and the like.

After the basic superconducting material is prepared, controlled spatial irradiation with ions (ion lithography) can be performed using several well known methods, such as by way of example but without limiting the scope of the invention:

1. focused ion beams (FIB) are produced using electrostatic focusing lenses that can project a beam of ions onto a target. Focusing can be achieved comparable to that of an e-beam lithography machine (50 nm) or
2. masked ion beam lithography is performed using a stencil mask between the incoming beam and the target material or
3. ion projection lithography is a combination of the methods a) and b). First the ions pass through a stencil mask and then the image of the pattern is projected onto a substrate using the electrostatic lenses.

Figure 3:
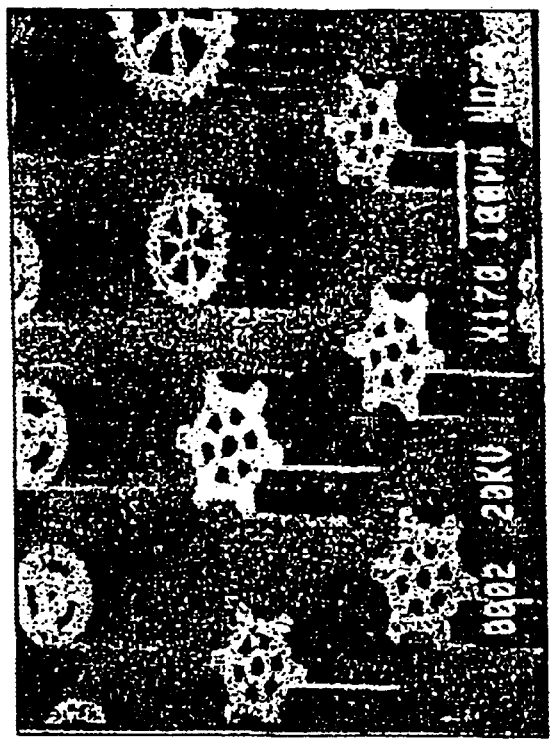
FIG. 3 is a micrograph showing the fabrication of high temperature superconducting micro-turbine and micro-rotors using heavy ion lithography.
Figure 3:

After the superconductor is irradiated in a predetermined pattern, chemical etching using a variety of methods that include, but are not limited to wet chemical etch and reactive ion etching is used selectively to remove the irradiated portions, leaving structures having predetermined shapes such as microturbines or microrotors, see FIG. 3.

EXAMPLE 1

High temperature superconducting YBCO single crystal was irradiated with high energy (1 GeV) Uranium ions at the Argonne Tandem Linear Accelerator. The irradiation dose was approximately $2*10^{11}$ ions/cm$^2$. The irradiation was controlled spatially by a stencil mask in a form of a slit. By periodically positioning the mask with respect to the sample, a periodic pattern was established such as the lines of irradiated and unirradiated regions 20 $\mu$m wide each as shown in FIG. 1. It is important that the ions pass completely through the work piece so the tracks or columnar defects, also termed amorphous material, are straight and parallel. Since the ions lose energy as they pass through the HTSC, if the beam energy is too low or the HTSC too thick the ion paths will curve as the ions lose energy, see FIG. 4. Therefore, heavy ions at high energies are required to prepare thick parts with high aspect ratios.

The periodically irradiated single crystal was immersed in a saturated solution of NaOH for about 5–10 minutes. FIG. 1 shows substantially enhanced etching (removal) of the superconducting material in the irradiated portions of the crystal with respect to the pristine portions.

EXAMPLE 2

Figure 5:
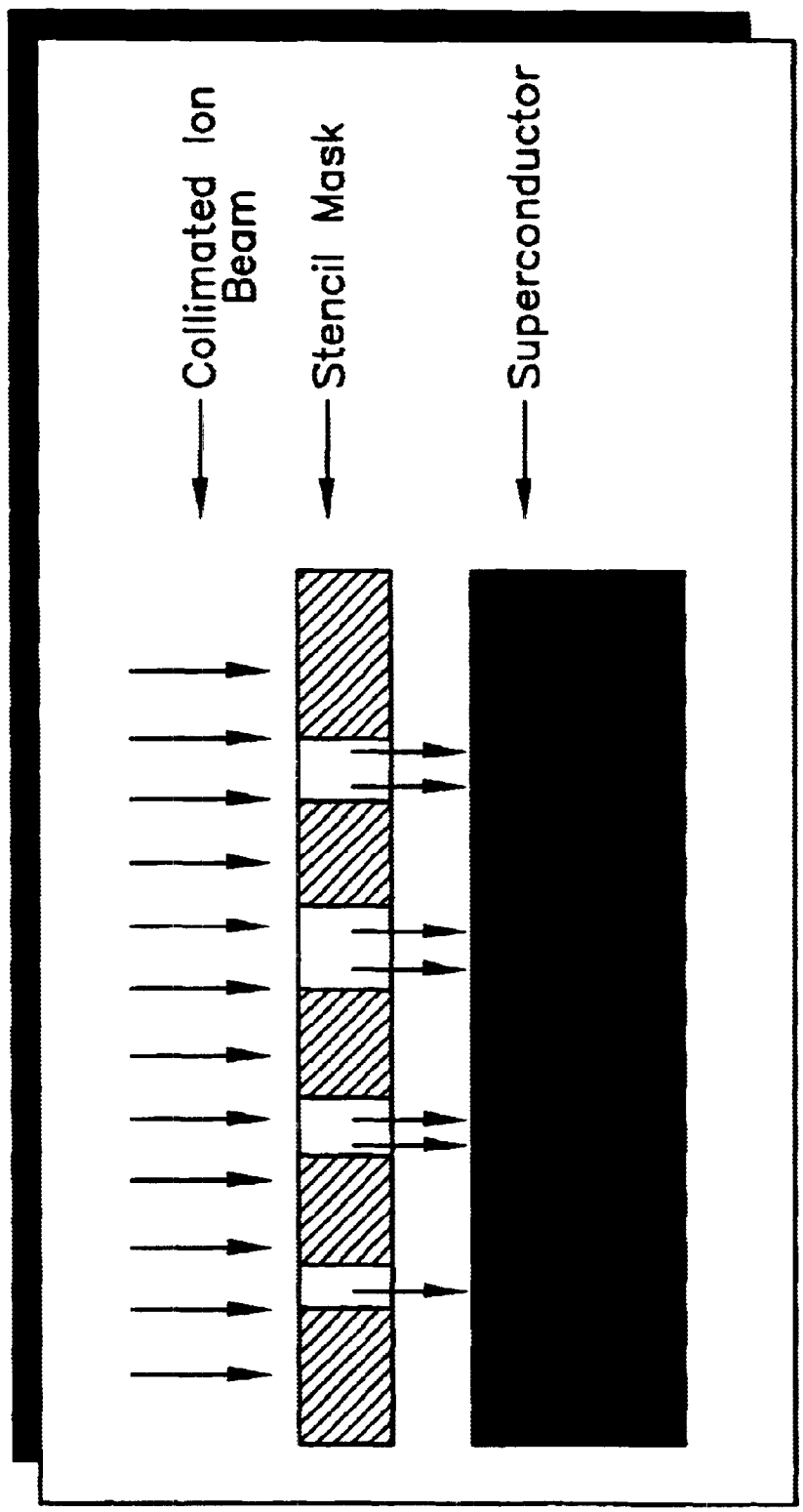
FIG. 5 is a schematic set up for producing a patterned dose of ion beams on a bulk superconductor.

The irradiation described in Example 1 was also performed using a stencil mask produced by LiGa technology, see FIG. 5. In this example substantial complexity of spatial modulation was achieved. Selective etching can be accomplished using wet chemical etch or other methods, such as RIE, laser assisted chemical etching.

EXAMPLE 3

Figure 6:
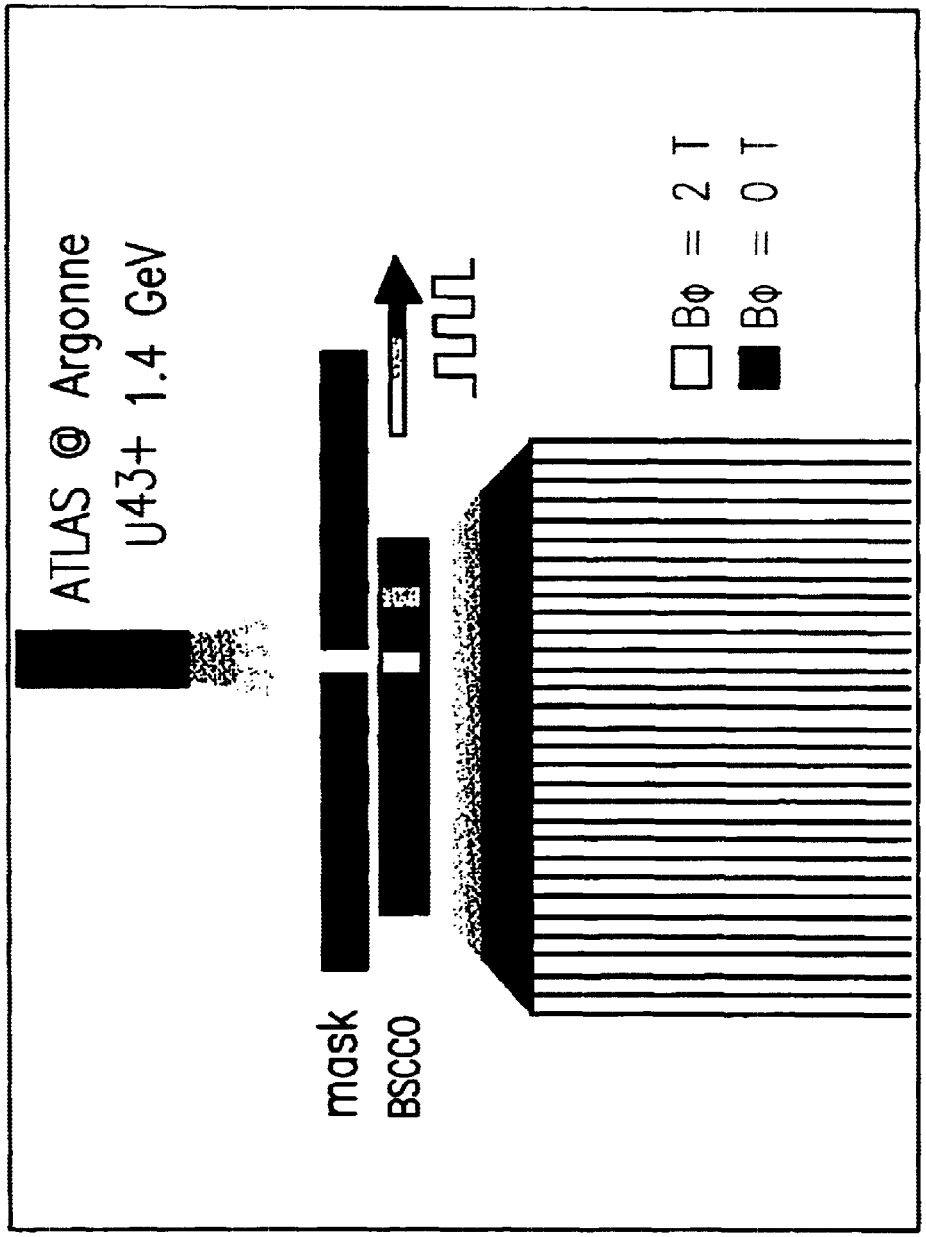
FIG. 6 is a schematic set-up showing heavy-ion lithography using a 1–4 GeV beam of $U^{43+}$ ions.

The irradiation described in Examples 1 and 2 can be followed by addition optical lithography step using polymethyl methocrylate (PMMA) photoresist, as illustrated in FIG. 6. This method provides for coverage of some of the irradiated areas with a photoresist and thus blocks the following selective etching process in masked areas.

Figure 7:
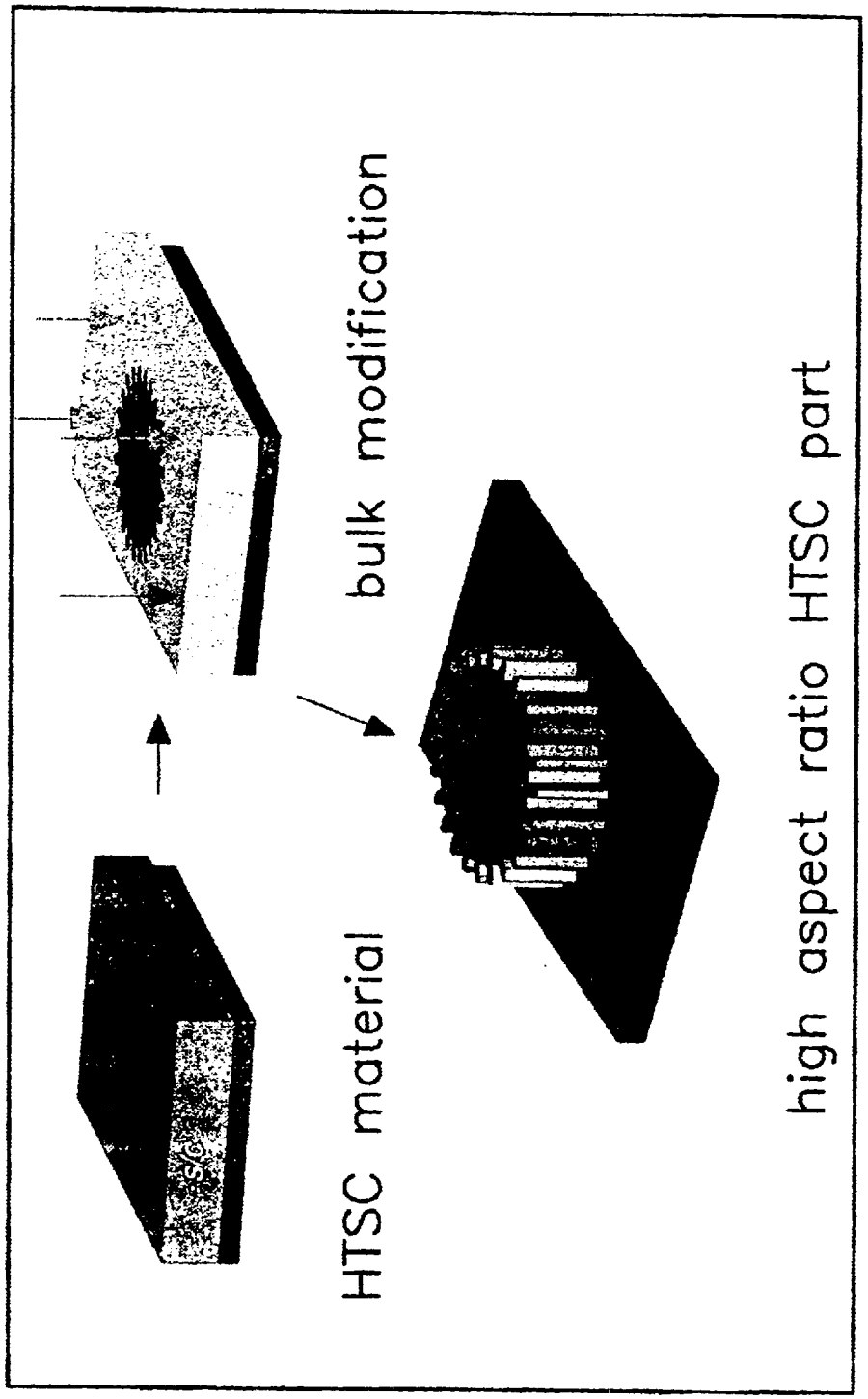
FIG. 7 is a schematic showing the production of a high aspect structure of a high temperature superconductor part.

The optical lithography step is thereafter followed by a selective chemical etch process as previously described in Example 1. Using the specified procedures, a device is formed having very precise geometrical boundaries, on the order of about 0.02 $\mu$m to about 0.1 $\mu$m and in addition contains spatially modulated bulk pinning properties that are independent of the geometrical form, see FIGS. 3 and 7. This is important, for instance, in forming superconducting motor devices useful for micropumps.

EXAMPLE 4

The irradiation described in Example 2 may also be performed using a stencil mask that has a varying thickness. By selecting the appropriate ions and their kinetic energy, depth profile of defect concentration can be achieved. For instance, a 1 GeV ion beam produces defects having a depth of about 20 $\mu$m. This method can provide structures which have a maximum defect concentration in the region away from the surface of the target material, resulting in devices such as Microwave Resonators.

Selective etching can be performed using wet chemical etch or other methods, such as RIE. As a result, it is possible to have material removed mostly from the inside of the target thus creating hollow structures.

EXAMPLE 5

Irradiation as described in Example 4 is followed by optical lithography step described above and illustrated in FIG. 6. As a result structures with tailored pinning strength profiles across the target superconductor thickness can be produced, which are useful, for example, in Superconducting Rotors With Enhanced Poles.

Bulk micro-machined parts offer several advantages over the surface micro-machined parts which presently dominate the MEMS fabrication:

(1) significantly higher power throughput due to larger cross section of superconducting material;
(2) stronger actuation forces because the magnetic moment is proportional to volume; and
(3) larger displacement volume which is proportional to the useful work.

To implement a bulk-micromachining process into a device fabrication sequence one needs to establish a method for bulk physical or chemical modification of the fabricated material. The only bulk micro-machining process successfully implemented today is LiGa (Lithography, Galvanoformung, Abformung). LiGa is based on bulk modification of thick PMMA (polymethyl-methacrylate) using soft X-ray exposure to chemically modify the PMMA throughout its thickness.

After the x-ray exposure the unexposed PMMA is selectively removed and very tall structures (up to several mm) with very high tolerance vertical walls (submicron run-off)

are obtained because the diffraction of x-rays at this length scale is negligible. Successive electroplating into the voids produces micro-parts out of the plated material (usually gold or nickel). This process is not directly applicable to HTSC materials due to difficulties with electroplating ceramic superconductors.

The alternative process for bulk modification of materials is heavy ion lithography. The potential of ion irradiation as a lithographic tool has been known for at least 20 years. Ion beam lithography has been used in several applications including replication of biological objects, polymer and metal membrane fabrication, and pinning of magnetic wall domains in magneto-optic garnet films. Heavy ion lithography resembles optical lithography with photons replaced by heavy ions. An important difference is that the heavy ions directly modify the material to be formed, while in optical lithography the photons act on a photosensitive layer which becomes the template for subsequent deposition or etching of the final structure. Light ion lithography experiments using light ions have resulted in nanometer size planar structures. The major problem hindering the application of ion beam lithography is the difficulty of fabricating free-standing stencil masks that are capable of stopping the energetic ions. The mask has to be of adequate thickness to stop the ions and release the heat load due to the ion current. The advent of the LiGA process enables fabrication of suitable thick high-aspect-ratio stencil masks. Thus, by this invention, it has become feasible to exploit the major advantages of ion beam lithography: absence of diffraction and minimal scattering of ions in the substrate material.

We have fabricated freestanding stencil masks and subjected HTSC single crystal to selective structural modifications. We have produced bulk modifications of a HTSC material and have shown that it produces spatial modulation of the pinning properties of the material.

The key to the success of the invention is the development of the following five. technological steps: (1) growth of high quality superconducting material; (2) selective bulk modification of HTSC material by heavy ions irradiation or synchrotron irradiation; (3) development of stencil masks for material patterning (using the LiGa process); (4) a chemical etching process for HTSC materials; (5) device integration and analysis.

First, high-aspect-ratio masks are fabricated to be used for bulk material modification by synchrotron and heavy ion irradiation. LiGa technology is used to produce stencil masks with aspect ratios higher than 10 (100–200 $\mu$m thick masks with 5–10 $\mu$m critical dimensions and 1 $\mu$m precision) that are sufficient to stop the incoming heavy ion beam irradiation and to sink the heat released in the process. The masks are used as a new heavy-ion-irradiation lithography tool. Finite element analysis is used to optimize the mask design for the effects of irradiation upon dimensional stability of the mask due to heat loading.

Heavy ion irradiation (FIG. 4) will be performed using the high vacuum lithographic positioning tool. Sample positioning with submicron precision has been routinely achieved in our experiments, a key feature of our bulk modification scheme. The tool will be modified to accommodate the stencil masks and provide adequate cooling and temperature stabilization.

A second method for direct modification of bulk single crystalline HTSC is. synchrotron irradiation. It is believed that X-rays can sufficiently modify the local chemical and physical properties of bulk material to achieve both enhanced pinning and preferential chemical etching. A formation of a $Ba(NO_3)$ second phase inside YBCO material after synchrotron X-ray irradiation has been reported. We will explore and develop techniques for bulk HTSC material modification by synchrotron irradiation.

It has been suggested that virtually any kind of acid will etch $YBa_2Cu_3O_x$. This leaves considerable freedom in designing and optimizing the chemical composition and concentration of the enchant for selective removal of bulk superconducting material. The chemistries developed for the simpler problem of etching thin superconducting films will serve as a good starting point in developing optimized methods for bulk HTSC fabrication. Our preliminary results confirm (FIG. 1): etching rates of order 1 $\mu$m/minute were obtained using diluted $HNO_3$ (1:100). However, we prefer a 1% solution of Br in methyl alcohol as an enchant.

The present invention, it is seen, is useful in the creation of high aspect ratio structures in general, high temperature superconducting structures in particular, by selective chemical etching of the ion irradiation-modified material to produce controlled relief on the superconductor surface (bulk) by controlling the ion irradiation dose and the etching time and combining the enhanced pinning properties in irradiated material with the spatial relief to create structures that have well defined spatial geometry and local pinning properties.

The described process for creating high aspect ratio structures can be implemented to create micro-electromechanical structures (known as MEMS) that may or may not have integrated conventional semiconductor electronics to perform controlled sensing or actuating process (smart MEMS), that is a microcontroller that can change, for example, filter characteristic depending on sensor values as in the bombs that can evade radar signals.

The process can be readily implemented for fabrication of active and passive elements in RF and microwave receivers and transmitters giving superior power handling. Integrated with MEMS technology tunable superconducting microwave elements can be fabricated, such as resonators or filters, using radiation doses of about $10^{13}$–$10^{16}$ defects/$m^2$ and etch times from minutes to 1 hour, depending on concentration and dose.

While there has been disclosed what is considered to be the preferred embodiment of the present invention, it is understood that various changes in the details may be made without departing from the spirit, or sacrificing any of the advantages of the present invention.

The embodiments of the invention in which an exclusive property or privilege is claimed are defined as follows:

1. A method of fabricating high aspect ratio ceramic structures, comprising providing a perovskite or perovskite-like crystalline material; exposing a selected portion of the crystalline material to a high energy ion beam for a time sufficient to cause the crystalline material contacted by the ion beam to have substantially parallel columnar defects, and thereafter etching selected portions of the material having substantially parallel columnar defects leaving material with and without substantially parallel columnar defects in a predetermined shape having high aspect ratios of not less than 2 to 1.

2. The method of claim 1, wherein the high energy ion beam is collimated and not less than 100 MeV and the irradiation produces substantially parallel columnar defects to a depth of not less than about 10 microns.

3. The method of claim 2, wherein the perovskite or perovskite-like material is an oxide which is superconducting at about 77° K.

4. The method of claim 1, wherein the high energy ion beam is not less than about 1 GeV and the irradiation produces substantially parallel columnar defects to a depth up to about 100 microns.

5. The method of claim 1, wherein the selected portion of the crystalline material is exposed to the high energy ion beam by masking other areas of the crystalline material with a material which stops the high energy ion beam from contacting the masked portion of the crystalline material.

6. The method of claim 5, wherein the material which stops the high energy ion beam is C, Cu, Au or alloys thereof.

7. The method of claim 1, wherein the high energy beam contains ions of one or more of Pb, Au and U.

8. The method of claim 7, the oxide includes at least one of an yttrium based superconductor, a bismuth based superconductor and a thallium based superconductor.

9. The method of claim 1, wherein the etching of selected portions of the material having substantially parallel columnar defects is with a base.

10. The method of claim 1, wherein the etching of selected portions of the material having substantially parallel columnar defects is with an acid.

11. The method of claim 1, wherein the etching of selected portions of the material having substantially parallel columnar defects is by contacting the selected portions with a solution of Br in alcohol.

12. The method of claim 11, wherein the portion of the material having substantially parallel columnar defects not etched is protected or masked from the etchant with a synthetic organic resin.

13. The method of claim 12, wherein the portion of the material having substantially parallel columnar defects not etched is masked with one or more of an alkane, an alkene and the salts thereof.

14. The method of claim 11, wherein the portion of the material having substantially parallel columnar defects not etched is masked with polymethyl methacrylate during contact with a solution of Br in ethyl alcohol.

15. A method of fabricating high aspect ratio ceramic structures, comprising providing a high temperature superconducting perovskite or perovskite-like crystalline material; masking some of the material with a substance capable of shielding the material from a high energy ion beam, exposing the unshielded portion of the crystalline material to a high energy ion beam for a time sufficient to cause the crystalline material contacted by the ion beam to have substantially parallel columnar defects to form a first geometrical shape of the high temperature superconducting material with improved pinning characteristics, thereafter etching selected portions of the material having substantially parallel columnar defects by PMMA lithography or optical lithography leaving material with and without substantially parallel columnar defectors in a second predetermined shape having high aspect ratios of not less than 2 to 1.

16. The method of claim 15, wherein masking of material from the high energy beam is with copper or gold.

17. The method of claim 16, wherein the ion beam includes Pb, Au or U ions at energies of not less than 100 MeV.

18. The method of claim 17, wherein PMMA lithography is used with a solution of Br in alcohol.

* * * * *